United States Patent
Chiang

(10) Patent No.: US 12,249,517 B2
(45) Date of Patent: Mar. 11, 2025

(54) MANUFACTURING METHOD OF SEMICONDUCTOR STRUCTURE

(71) Applicant: HON HAI PRECISION INDUSTRY CO., LTD., New Taipei (TW)

(72) Inventor: Kuang-Hao Chiang, Taoyuan (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 531 days.

(21) Appl. No.: 17/646,487

(22) Filed: Dec. 30, 2021

(65) Prior Publication Data
US 2023/0115949 A1   Apr. 13, 2023

(30) Foreign Application Priority Data
Oct. 8, 2021   (TW) .................................. 110137499

(51) Int. Cl.
*H01L 21/465* (2006.01)
*H01L 21/3213* (2006.01)
*H01L 25/065* (2023.01)

(52) U.S. Cl.
CPC ...... *H01L 21/465* (2013.01); *H01L 21/32134* (2013.01); *H01L 25/0657* (2013.01)

(58) Field of Classification Search
None
See application file for complete search history.

(56) References Cited

U.S. PATENT DOCUMENTS

| | | | |
|---|---|---|---|
| 10,804,410 B2 | 10/2020 | Chao et al. | |
| 2018/0301531 A1* | 10/2018 | Xie | H01L 21/02532 |
| 2019/0088553 A1* | 3/2019 | Van Dal | H01L 21/823871 |
| 2019/0172755 A1* | 6/2019 | Smith | H01L 27/0922 |
| 2020/0098756 A1* | 3/2020 | Lilak | H01L 29/66545 |
| 2020/0294866 A1 | 9/2020 | Cheng et al. | |

FOREIGN PATENT DOCUMENTS

TW   202125597 A   7/2021

* cited by examiner

*Primary Examiner* — Stephanie P Duclair
(74) *Attorney, Agent, or Firm* — CKC & Partners Co., LLC

(57) ABSTRACT

A manufacturing method of a semiconductor structure includes the following operations. A stacked structure is formed on a substrate. The stacked structure includes semiconductor layers and sacrificial layers that are alternately stacked, in which the sacrificial layers include germanium, and germanium concentrations of the sacrificial layers decrease from bottom to top. A dummy gate structure is formed on the stacked structure. A spacer is formed on both sides of the dummy gate structure. The dummy gate structure is removed, thereby forming an opening. The sacrificial layers are removed from the opening. A gate structure is formed to cover the semiconductor layers. In another manufacturing method, the stacked structure includes semiconductor layers and sacrificial layers that are alternately stacked, in which thicknesses of the semiconductor layers increase from bottom to top, or thicknesses of the sacrificial layers increase from bottom to top.

19 Claims, 13 Drawing Sheets

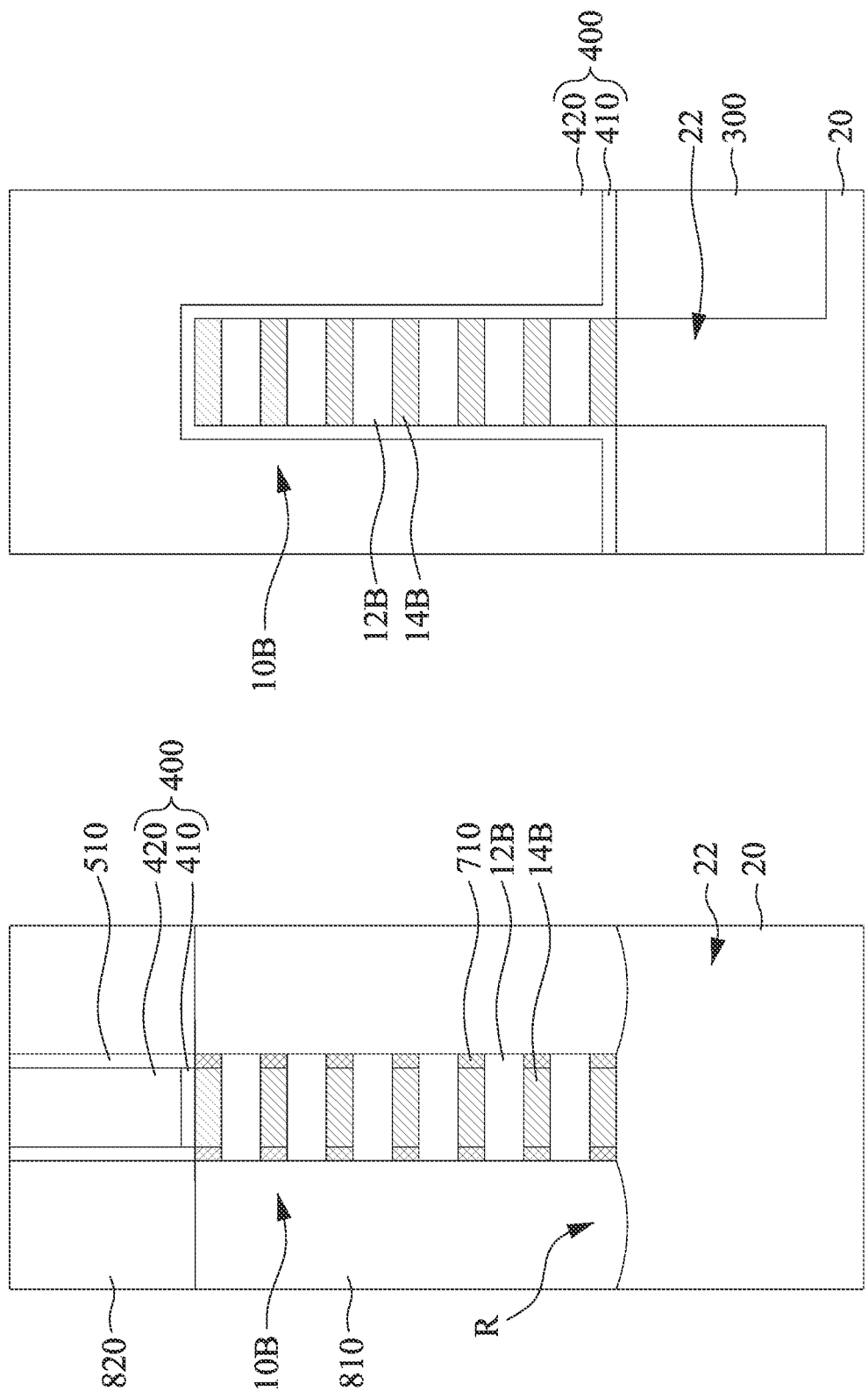

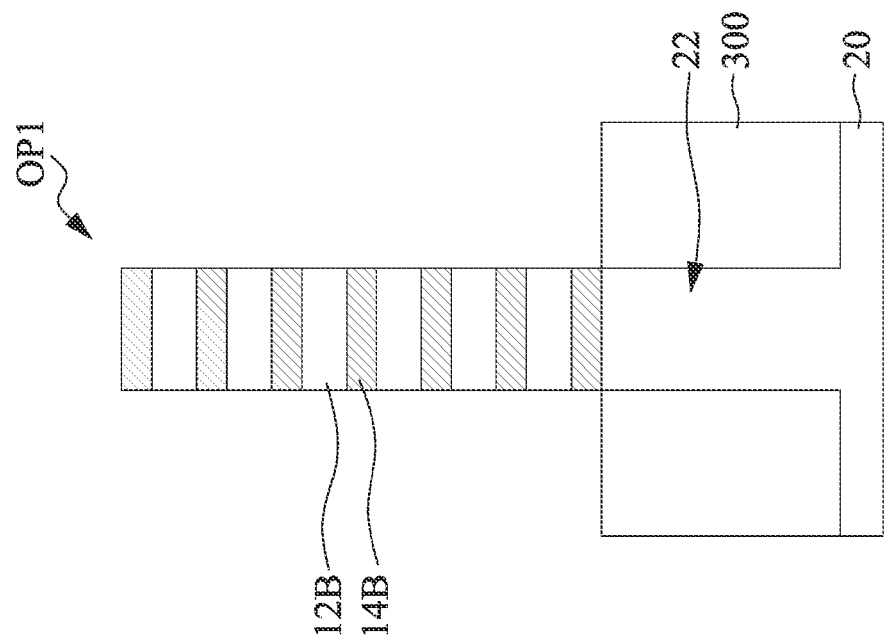
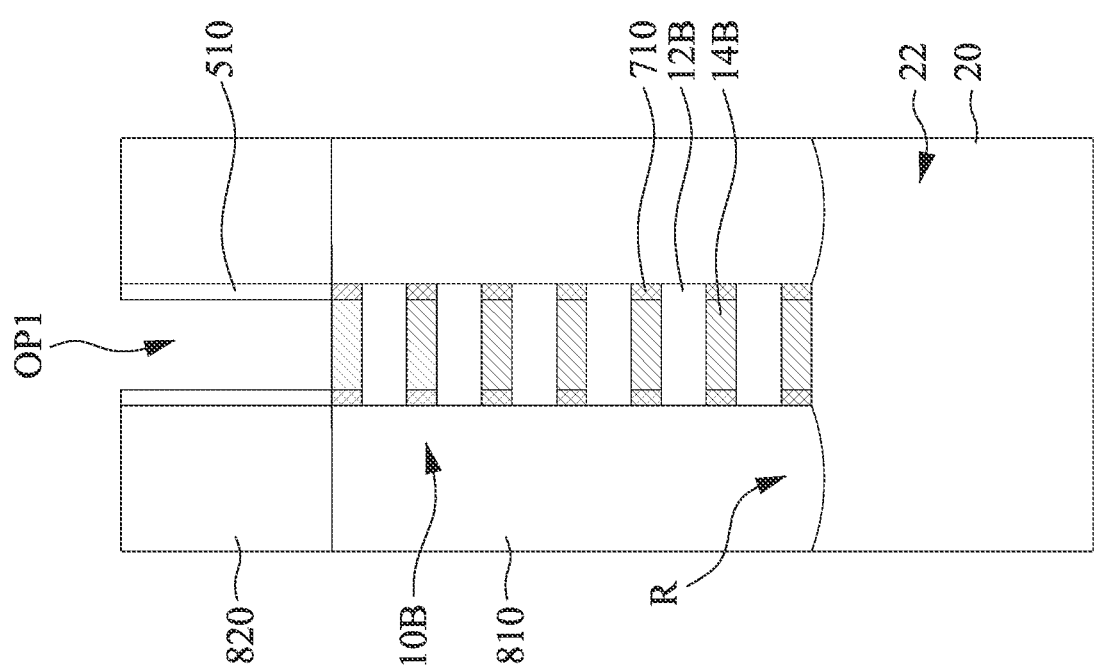

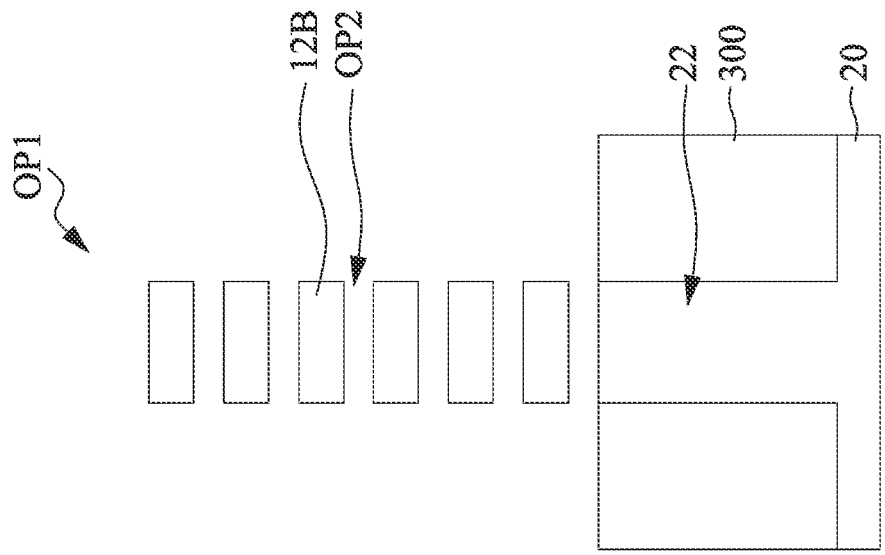
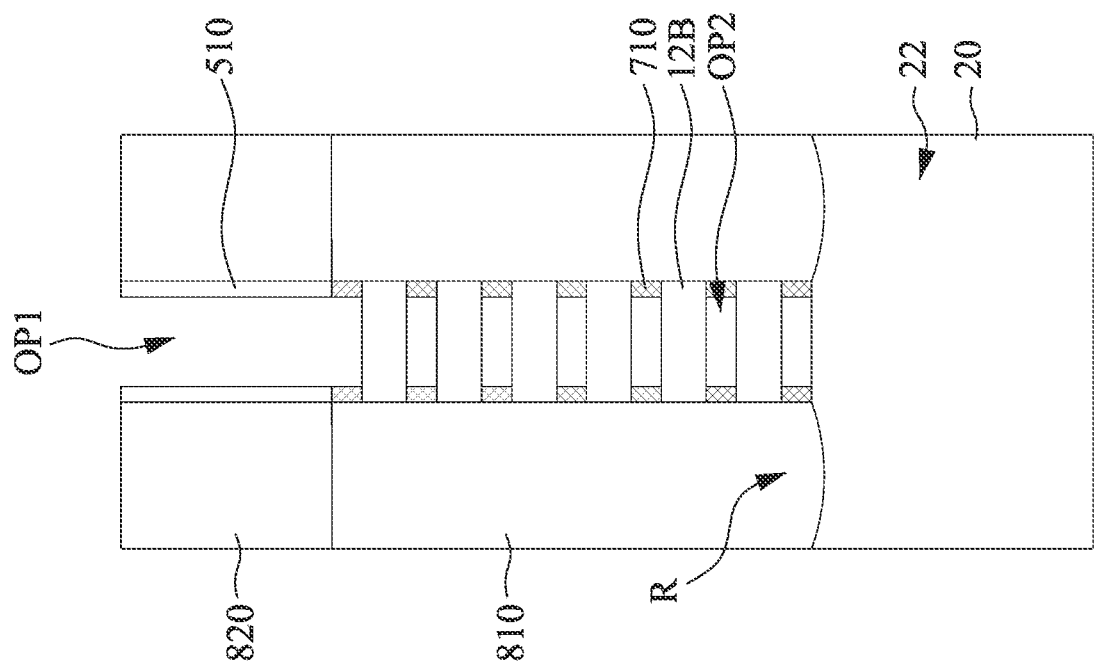
Fig. 10A
Fig. 10B

MANUFACTURING METHOD OF SEMICONDUCTOR STRUCTURE

CROSS-REFERENCE TO RELATED APPLICATION

This application claims priority to Taiwan Application Serial Number 110137499, filed Oct. 8, 2021, which is herein incorporated by reference.

BACKGROUND

Field of Invention

The present disclosure relates to a manufacturing method of a semiconductor structure.

Description of Related Art

A manufacturing process of the semiconductor integrated circuit has experienced exponential growth. At present, multiple generations of the integrated circuit have been developed, and each generation has smaller and more complex circuits than the previous generation. In the process of the development of the integrated circuit, the functional density is usually increased, and the geometric size is reduced, thereby increasing the complexity of the manufacturing process. For example, with the development of integrated circuit technology towards smaller technology nodes, a multi-gate device has been developed, such as, gate-all-around field-effect transistor (GAAFET). Compared with a planar transistor, the GAAFET can better control channels and can reduce the short-channel effect.

However, the etching process for manufacturing the GAAFET may cause the uneven shapes of the channels, thereby adversely affecting the performance of the GAAFET. In view of this, it is necessary to develop a new manufacturing method to overcome the above-mentioned problems.

SUMMARY

The present disclosure provides a manufacturing method of a semiconductor structure. The manufacturing method includes the following operations. A stacked structure is formed on a substrate. The stacked structure includes a plurality of semiconductor layers and a plurality of sacrificial layers that are alternately stacked, in which the sacrificial layers include germanium, and germanium concentrations of the sacrificial layers decrease from bottom to top. A dummy gate structure is formed on the stacked structure. A spacer is formed on both sides of the dummy gate structure. The dummy gate structure is removed, thereby forming an opening. The sacrificial layers are removed from the opening. A gate structure is formed to cover the semiconductor layers.

In some embodiments, the semiconductor layers include silicon, silicon carbide, or silicon phosphide, and the sacrificial layers include silicon-germanium, germanium, or germanium-tin.

In some embodiments, thicknesses of the semiconductor layers increase from bottom to top.

In some embodiments, thicknesses of the sacrificial layers increase from bottom to top.

In some embodiments, forming the stacked structure includes forming a first sacrificial layer on the substrate. A first semiconductor layer is formed on the first sacrificial layer. A second sacrificial layer is formed on the first semiconductor layer, in which a germanium concentration of the second sacrificial layer is less than a germanium concentration of the first sacrificial layer. A second semiconductor layer is formed on the second sacrificial layer.

In some embodiments, in any two of the sacrificial layers adjacent to each other in a vertical direction, the germanium concentration of the sacrificial layer below is 5 at % to 15 at % greater than the germanium concentration of the sacrificial layer above.

In some embodiments, the germanium concentrations of the sacrificial layers decrease by a constant amount from bottom to top.

The present disclosure provides a manufacturing method of a semiconductor structure. The manufacturing method includes the following operations. A stacked structure is formed on a substrate. The stacked structure includes a plurality of semiconductor layers and a plurality of sacrificial layers that are alternately stacked, in which thicknesses of the semiconductor layers increase from bottom to top, or thicknesses of the sacrificial layers increase from bottom to top. A dummy gate structure is formed on the stacked structure. A spacer is formed on both sides of the dummy gate structure. The dummy gate structure is removed, thereby forming an opening. The sacrificial layers are removed from the opening. A gate structure is formed to cover the semiconductor layers.

In some embodiments, the thicknesses of the semiconductor layers increase from bottom to top, and forming the stacked structure includes the following operations. A first sacrificial layer is formed on the substrate. A first semiconductor layer is formed on the first sacrificial layer. A second sacrificial layer is formed on the first semiconductor layer. A second semiconductor layer is formed on the second sacrificial layer, in which a thickness of the second semiconductor layer is greater than a thickness of the first semiconductor layer.

In some embodiments, the thicknesses of the sacrificial layers increase from bottom to top, and forming the stacked structure includes the following operations. A first sacrificial layer is formed on the substrate. A first semiconductor layer is formed on the first sacrificial layer. A second sacrificial layer is formed on the first semiconductor layer, in which a thickness of the second sacrificial layer is greater than a thickness of the first sacrificial layer. A second semiconductor layer is formed on the second sacrificial layer.

In some embodiments, the semiconductor layers include silicon, silicon carbide, or silicon phosphide, and the sacrificial layers include silicon-germanium, germanium, or germanium-tin.

In some embodiments, the sacrificial layers include germanium, and in any two of the sacrificial layers adjacent to each other in a vertical direction, a germanium concentration of the sacrificial layer below is 5 at % to 15 at % greater than a germanium concentration of the sacrificial layer above.

In some embodiments, the thicknesses of the semiconductor layers increase by a constant amount from bottom to top.

In some embodiments, the thicknesses of the sacrificial layers increase by a constant amount from bottom to top.

In some embodiments, removing the sacrificial layers from the opening is performed by a wet etching.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 8A, FIG. 9A, FIG. 10A, and FIG. 11A are cross-sectional schematic views in the process of manufacturing the semiconductor structure according to various embodiments of the present disclosure, which continues after FIG. 7B.

FIG. 8B, FIG. 9B, FIG. 9C, FIG. 9D, FIG. 10B, and FIG. 11B are cross-sectional schematic views in the process of manufacturing the semiconductor structure according to various embodiments of the present disclosure, which continues after FIG. 7C.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Although a series of operations or steps below are utilized to illustrate the methods disclosed herein, the order shown by these operations or steps should not be construed as a limitation of this disclosure. For example, certain operations or steps may be performed in a different order and/or in conjunction with other steps. In addition, not all of the operations, steps, and/or features illustrated must be performed in order to implement the embodiment of the disclosure. Further, each operation or step described herein may contain several sub-steps or actions.

The present disclosure provides a manufacturing method of a semiconductor structure. Please refer to FIG. 1, FIG. 2, FIG. 3, FIG. 4, FIG. 5, FIG. 6, FIG. 7A, FIG. 7B, FIG. 7C, FIG. 8A, FIG. 8B, FIG. 9A, FIG. 9B, FIG. 9C, FIG. 9D, FIG. 10A, FIG. 10B, FIG. 11A and FIG. 11B. In some embodiments, the manufacturing method of the present disclosure can be applied to fabricate a nanosheet field-effect transistor (NSFET), a nanowire field-effect transistor (NWFET), a gate-all-around field-effect transistor (GAAFET), and so on.

Figure 1:
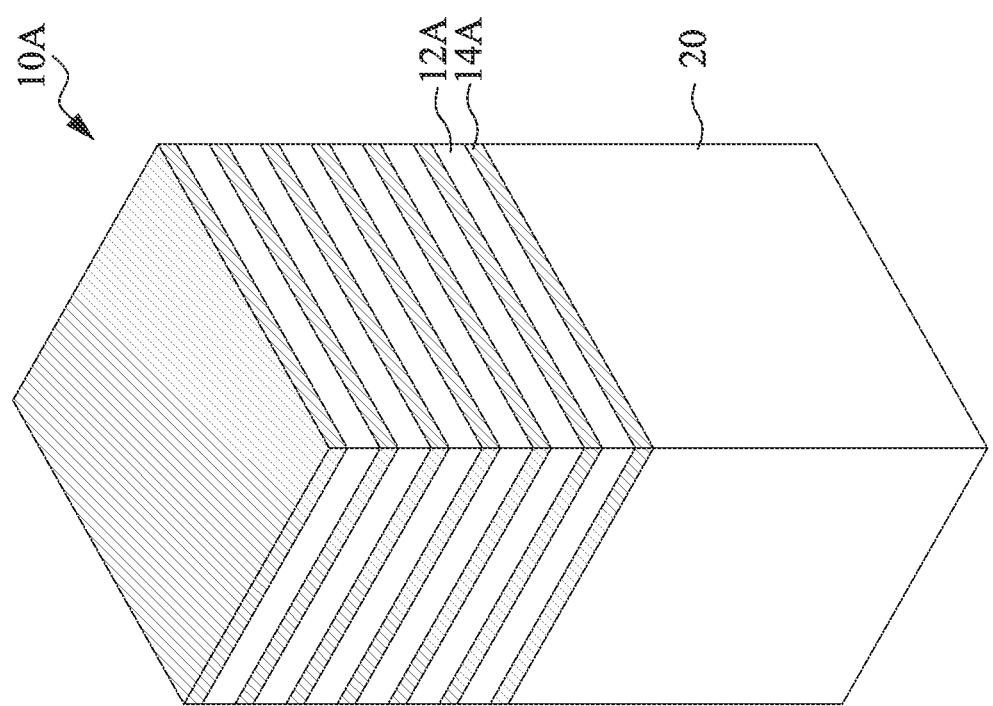
FIG. 1, FIG. 2, FIG. 3, FIG. 4, FIG. 5, FIG. 6, and FIG. 7A are schematic views in a process of manufacturing a semiconductor structure according to various embodiments of the present disclosure.

As shown in FIG. 1, a multilayer stack 10A is formed on a substrate 20. The multilayer stack 10A includes a plurality of semiconductor layers 12A and a plurality of sacrificial layers 14A stacked alternately. FIG. 1 shows six semiconductor layers 12A and seven sacrificial layers 14A. However, it is only an illustration, and the number of the semiconductor layers 12A and the sacrificial layers 14A can be arbitrarily adjusted according to design requirements.

In some embodiments, the semiconductor layers 12A include silicon, silicon carbide, or silicon phosphide, and the sacrificial layers 14A include silicon-germanium, germanium, or germanium-tin. In some embodiments, the semiconductor layers 12A are doped with group V element. For example, the semiconductor layers 12A include silicon carbide doped with phosphorus. In some embodiments, the sacrificial layers 14A are doped with group III element. For example, the sacrificial layers 14A include silicon-germanium doped with boron.

In some embodiments, the sacrificial layers 14A include germanium, and germanium concentrations of the sacrificial layers 14A decrease from bottom to top. For example, the germanium concentrations of the sacrificial layers 14A shown in FIG. 1 gradually decrease by a constant amount from bottom to top. For example, the germanium concentration of the lowermost sacrificial layer 14A is 90 at %, and the germanium concentration of the uppermost sacrificial layer 14A is 10 at %. In the following content, the benefits brought by the decreasing germanium concentrations of sacrificial layers 14A from bottom to top will be further described. In some embodiments, forming the multilayer stack 10A includes: forming a first sacrificial layer on the substrate 20. A first semiconductor layer is formed on the first sacrificial layer. A second sacrificial layer is formed on the first semiconductor layer, in which a germanium concentration of the second sacrificial layer is less than a germanium concentration of the first sacrificial layer. A second semiconductor layer is formed on the second sacrificial layer. Repeating the above operations can form the sacrificial layers 14A, in which the germanium concentrations decrease from bottom to top.

In some embodiments, the semiconductor layers 12A and the sacrificial layers 14A in the multilayer stack 10A can be deposited by the following process, such as vapor phase epitaxy (VPE), molecular beam epitaxy (MBE), chemical vapor deposition (CVD), or atomic layer deposition (ALD).

Each layer in the multilayer stack 10A may have a small thickness, such as about 5 nm to about 30 nm. In some embodiments, thicknesses of the semiconductor layers 12A increase from bottom to top. For example, the thicknesses of the semiconductor layers 12A gradually increase by a constant amount from bottom to top. In some embodiments, forming the multilayer stack 10A includes the following operations. A first sacrificial layer is formed on the substrate. A first semiconductor layer on the first sacrificial layer. A second sacrificial layer is formed on the first semiconductor layer. A second semiconductor layer is formed on the second sacrificial layer, in which a thickness of the second semiconductor layer is greater than a thickness of the first semiconductor layer. Repeating the above operations can form the semiconductor layers 12A with increasing thicknesses from bottom to top. In other embodiments, thicknesses of the sacrificial layers 14A increase from bottom to top. For example, thicknesses of the sacrificial layers 14A gradually increase by a constant amount from bottom to top. In some embodiments, forming the multilayer stack 10A includes the following operations. A first sacrificial layer is formed on the substrate. A first semiconductor layer is formed on the first sacrificial layer. A second sacrificial layer is formed on the first semiconductor layer, in which a thickness of the second sacrificial layer is greater than a thickness of the first sacrificial layer. A second semiconductor layer is formed on the second sacrificial layer. Repeating the above operations can form the sacrificial layers 14A with increasing thicknesses from bottom to top. In the following content, the benefits brought by the above-mentioned embodiments will be further described.

In some embodiments, the substrate 20 is a semiconductor substrate, such as a bulk semiconductor, a semiconductoron-insulator (SOI) substrate, or the like. The semiconductor substrate may be doped (with p-type or n-type dopant) or undoped. The substrate 20 may be a wafer, such as a silicon wafer. Generally speaking, SOI substrate is a layer of semiconductor material formed on an insulator layer. The insulator layer is, for example, an oxide layer, a silicon oxide layer, or the like. In some embodiments, the semiconductor material of substrate 20 includes silicon; germanium; compound semiconductor, including silicon carbide, gallium arsenide, gallium phosphide, indium phosphide, indium arsenide, and/or indium antimonide; alloy semiconductor, including germanium-silicon, phosphorus gallium arsenide, aluminum indium arsenide, aluminum gallium arsenide, gallium indium arsenide, gallium indium phosphide, and/or indium gallium arsenide phosphide; or combinations thereof.

Figure 2:
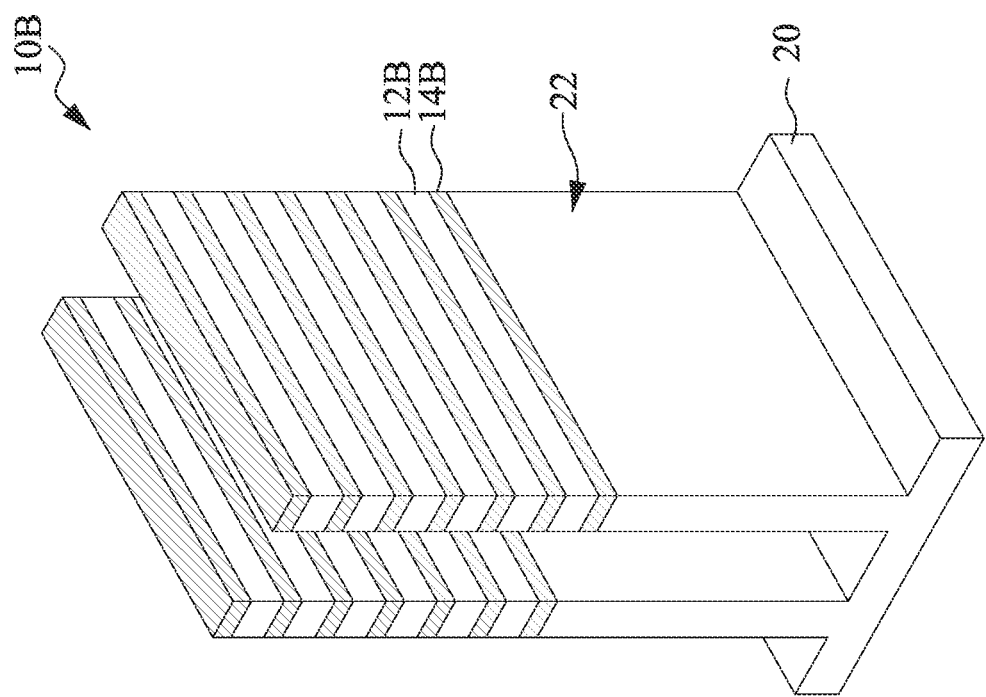

As shown in FIG. 2, the multilayer stack 10A and the substrate 20 are patterned to form stacked structures 10B and fins 22. The stacked structures 10B include a plurality of semiconductor layers 12B and a plurality of sacrificial layers 14B. The fins 22 are patterned semiconductor strips in the substrate 20. The semiconductor layers 12B and the sacrificial layers 14B respectively include the remaining parts of the semiconductor layers 12A and the sacrificial layers 14A. In some embodiments, the stacked structures 10B are nanosheets, nanoribbons, or nanowires. In some embodiments, the patterning can be performed by a process such as a reactive ion etch (RIE), a neutral beam etch (NBE), or combinations thereof. In some embodiments, widths of the stacked structures 10B are greater than or equal to 25 nm. For example, the widths of the stacked structures 10B are 25, 30, 40, 50, 60, 70, 80, 90, 100, 110, or 120 nm.

Figure 3:
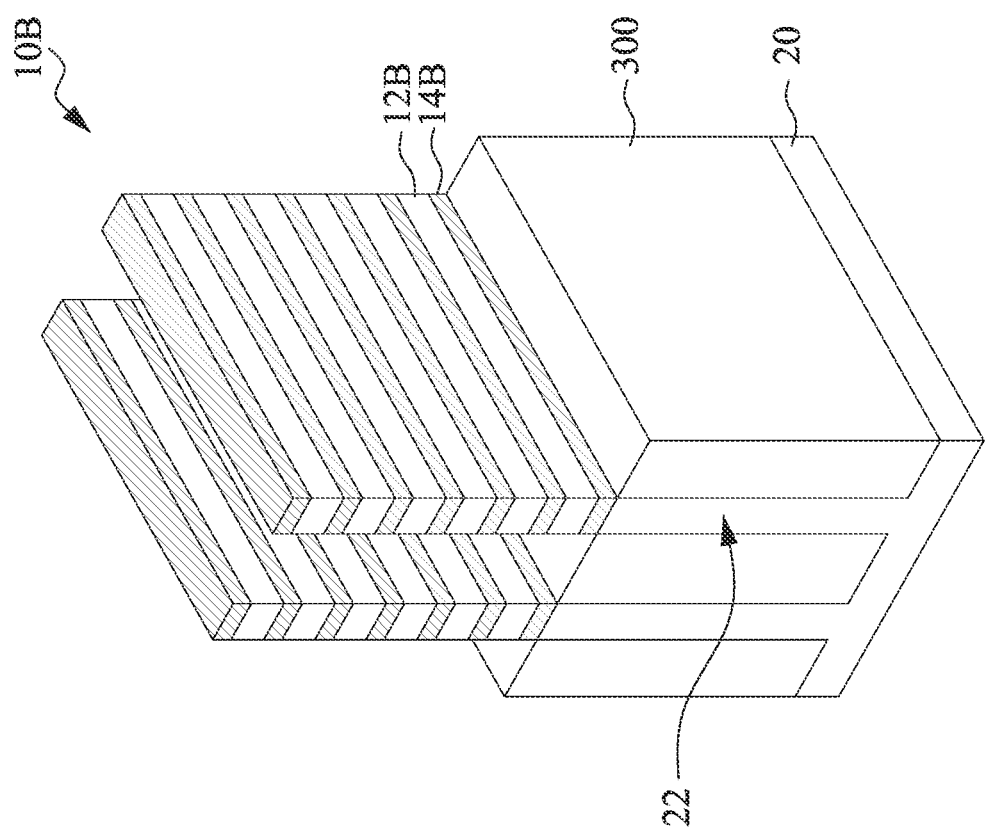

As shown in FIG. 3, shallow trench isolation regions (STI regions) 300 are formed on the substrate 20 and between adjacent fins 22. The STI regions 300 surround at least a part of the fins 22, so that at least a part of the stacked structures 10B protrude from the adjacent STI regions 300. In some embodiments, STI regions 300 include oxide, such as silicon oxide; nitride, such as silicon nitride, or combinations thereof. In some embodiments, the STI regions 300 can be formed by a CVD process, such as a high density plasma CVD (HDP-CVD), a flowable CVD (FCVD), or combinations thereof.

Figure 4:
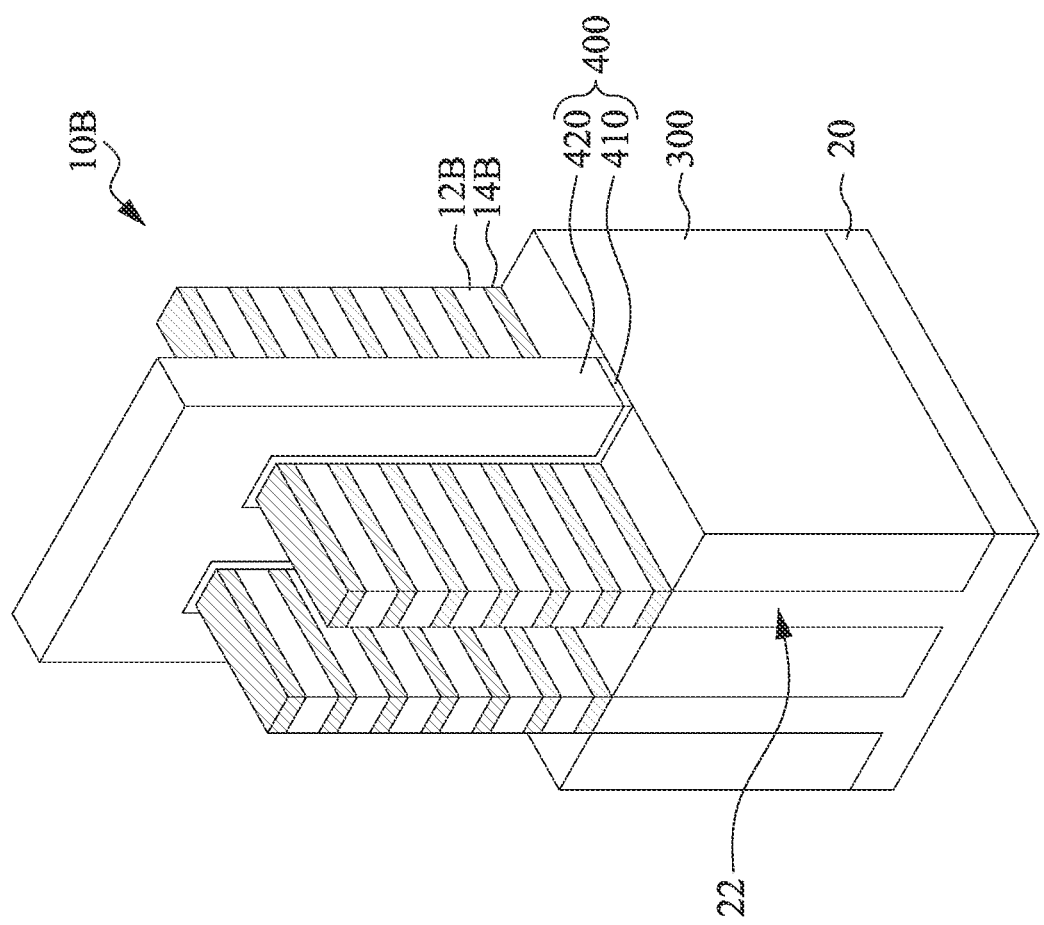

As shown in FIG. 4, a dummy gate structure 400 is formed on the stacked structures 10B. The dummy gate structure 400 includes a dummy dielectric layer 410 and a dummy gate 420. For example, the dummy gate structure 400 can be formed by the following steps. A dummy dielectric layer 410 is formed to fully cover the stacked structures 10B and the STI regions 300 shown in FIG. 3. A dummy gate layer is formed on the dummy dielectric layer 410. A patterned mask is formed on the dummy gate layer. The pattern of the patterned mask is transferred to the dummy gate layer and the dummy dielectric layer 410 to form the dummy dielectric layer 410 and the dummy gate 420 as shown in FIG. 4. The dummy gate 420 may have a length direction substantially perpendicular to a length direction of the fins 22. In some embodiments, the dummy gate 420 may be formed of conductive or non-conductive material, such as amorphous silicon, polycrystalline silicon, polycrystalline silicon-germanium, metal, metal nitride, metal silicide, metal oxide, and so on.

Figure 5:
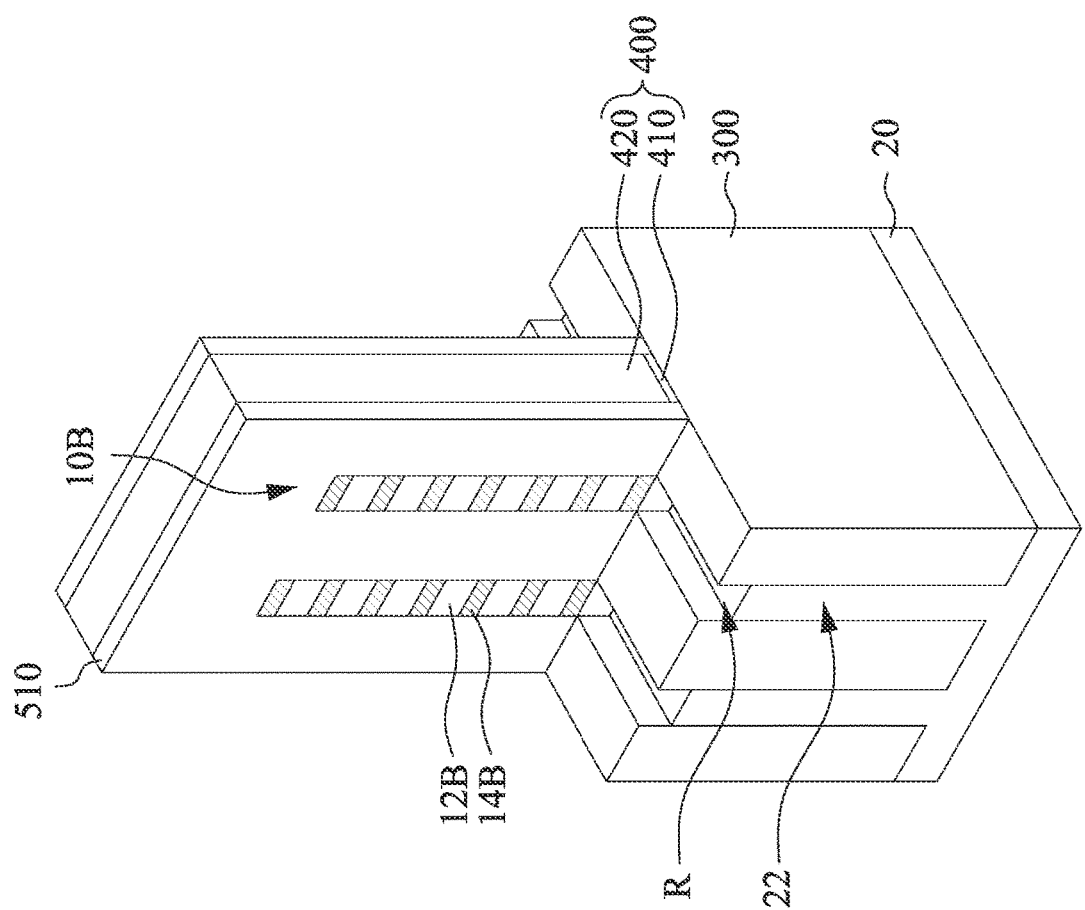

As shown in FIG. 5, a spacer 510 is formed on both sides of the dummy gate structure 400. Parts of the stacked structure 10B that are not covered by the dummy gate structure 400 and the spacer 510 are removed, and the upper part of the fins 22 is removed to form recesses R. In some embodiments, the spacer 510 includes one or more layers of dielectric material. For example, the dielectric material includes silicon oxide, silicon nitride, silicon oxynitride, silicon carbon oxynitride, or combinations thereof. In some embodiments, the spacer 510 is formed by the following conformal deposition process, such as a CVD, a plasma-enhanced chemical vapor deposition (PECVD), an ALD, a plasma-enhanced atomic layer deposition (PEALD), and so on. In some embodiments, the stacked structures 10B are removed by using an anisotropic etching process (such as RIE, NBE, etc.).

Figure 6:
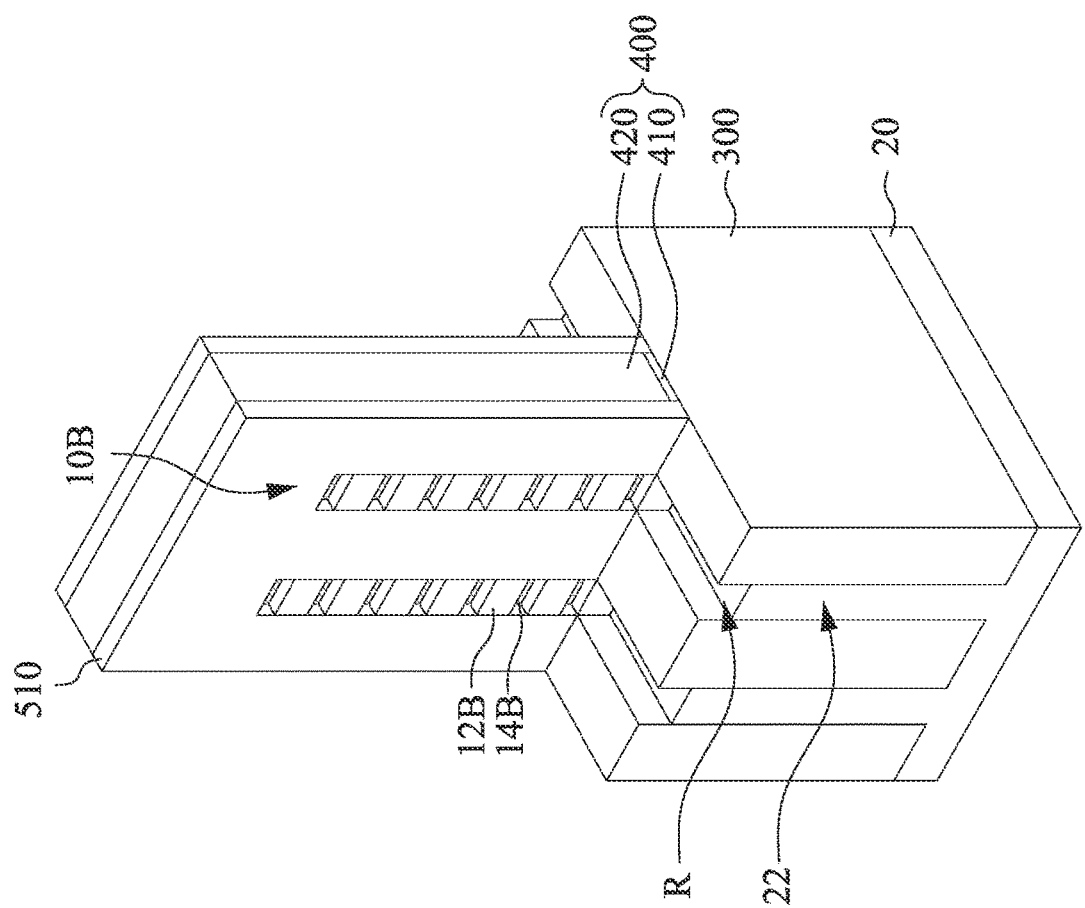

As shown in FIG. 6, parts of the sacrificial layers 14B in the stacked structures 10B are etched. In more detail, the exposed sidewalls of the sacrificial layers 14B are etched to form recesses between adjacent semiconductor layers 12B. In some embodiments, the etching is performed by using an anisotropic etching process (such as RIE, NBE, etc.).

Figure 7A:
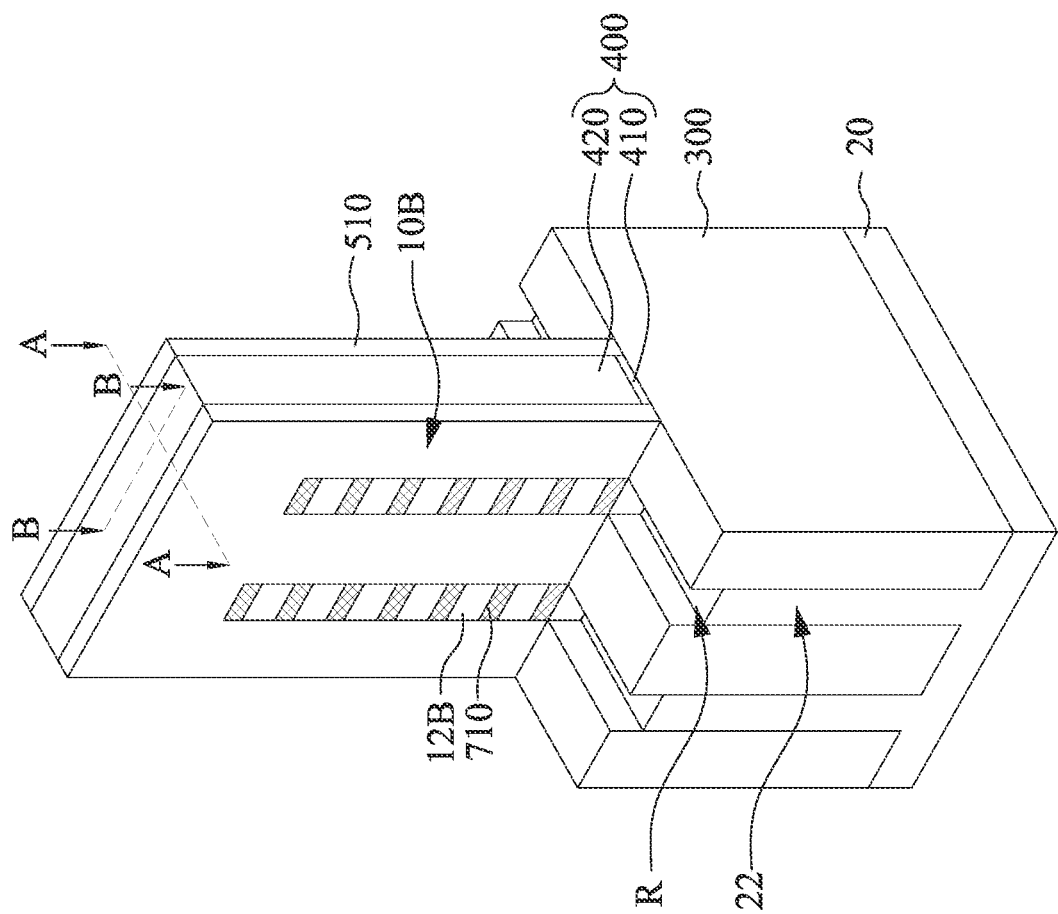
Figure 7C:
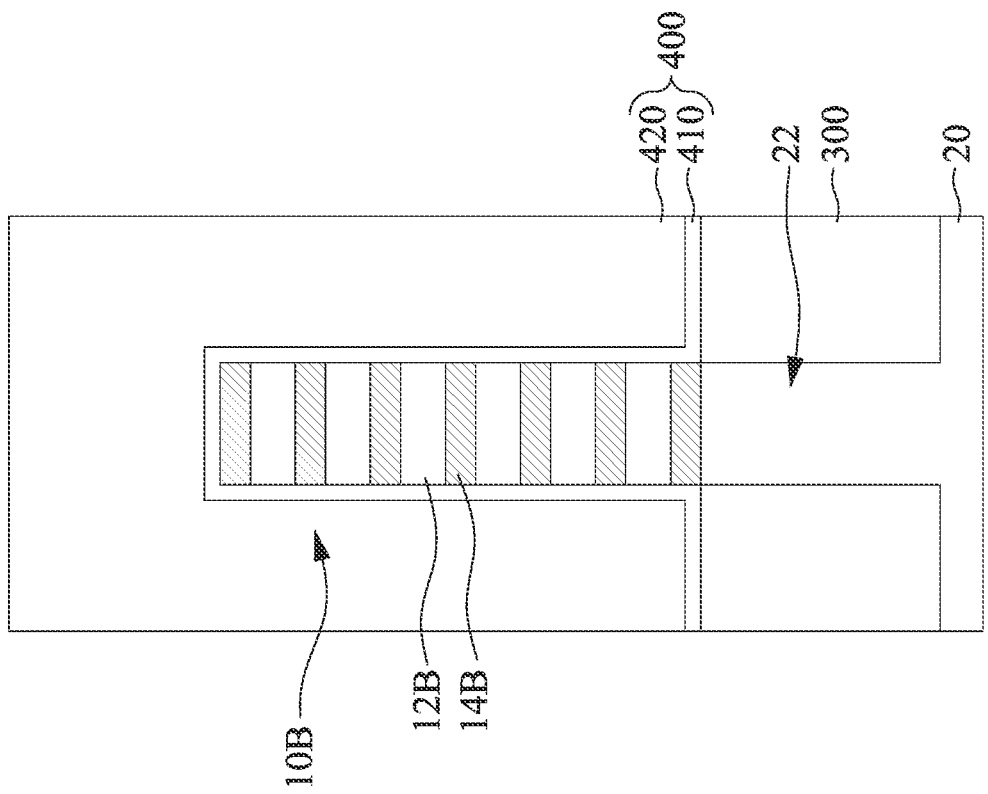
FIG. 7C is a cross-sectional schematic view along a line B-B in FIG. 7A.
Figure 7B:
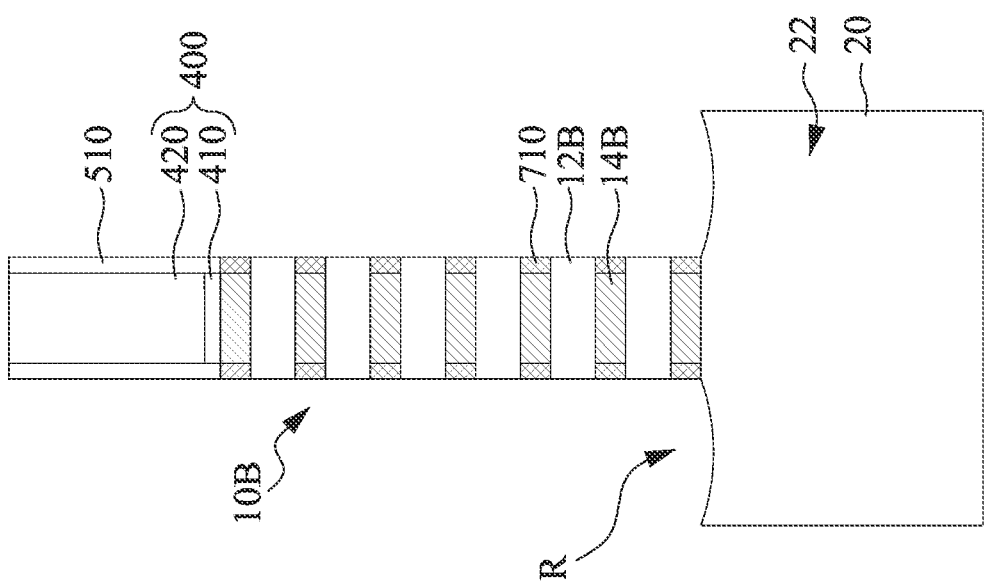
FIG. 7B is a cross-sectional schematic view along a line A-A in FIG. 7A.

Please refer to FIG. 7A, FIG. 7B, and FIG. 7C. FIG. 7B is a cross-sectional schematic view along a line A-A in FIG. 7A. FIG. 7C is a cross-sectional schematic view along a line B-B in FIG. 7A.

As shown in FIG. 7A and FIG. 7B, inner spacers 710 are formed in the recesses between the adjacent semiconductor layers 12B. Since source/drain regions will be formed in the recesses R in the subsequent process, and the dummy gate structure 400 will be replaced with a gate structure, the inner spacers 710 can serve as an isolation feature between the gate structure and the source/drain regions that are formed in the subsequent process. In addition, the inner spacers 710 can also prevent the source/drain regions from being damaged during the subsequent operation of etching the sacrificial layers 14B. As shown in FIG. 7C, the stacked structure 10B is covered by the dummy gate structure 400.

Please refer to FIG. 8A, FIG. 9A, FIG. 10A and FIG. 11A, and the above figures describe a subsequent process after FIG. 7B. Please refer to FIG. 8B, FIG. 9B, FIG. 10B and FIG. 11B, and the above figures describe a subsequent process after FIG. 7C.

As shown in FIG. 8A, source/drain regions 810 are formed in the recesses R. An interlayer dielectric 820 is formed on the source/drain regions 810. The source/drain regions 810 are disposed on both sides of the stacked structure 10B. In some embodiments, the source/drain regions 810 are formed by epitaxial growth. In other embodiments, before forming the interlayer dielectric 820 on the source/drain regions 810, a contact etch stop layer (not shown) is formed to cover the source/drain regions 810 and the spacer 510. As shown in FIG. 8B, when the source/drain regions 810 and the interlayer dielectric 820 are formed, the above components are not shown in the cross-sectional schematic view of FIG. 8B.

As shown in FIG. 9A and FIG. 9B, the dummy gate structure 400 is removed to form opening OP1. In some embodiments, the dummy gate structure 400 is removed by an anisotropic dry etching process. During the removal, when the dummy gate 420 of FIG. 8A is etched, the dummy dielectric layer 410 serves as an etch stop layer, and then the dummy dielectric layer 410 is removed. As shown in FIG. 9B, after removing the dummy gate structure 400, the stacked structure 10B is exposed through opening OP1.

As shown in FIG. 10A and FIG. 10B, the sacrificial layers 14B are removed from the opening OP1, and openings OP2 are formed between the adjacent semiconductor layers 12B. For example, the sacrificial layers 14B are removed by an etching process. In some embodiments, when the semiconductor layers 12B include silicon, the sacrificial layers 14B include silicon-germanium. The sacrificial layers 14B can be removed by a wet etching with an etchant such as tetramethylammonium hydroxide (TMAH), ammonium hydroxide ($NH_4OH$), and so on.

Generally speaking, in the etching process, the rate of etching the upper part of the stacked structure is faster than the rate of etching the lower part of the stacked structure. Therefore, after removing the sacrificial layers, it is easy to cause that the upper semiconductor layers in the remaining semiconductor layers have thinner thicknesses and smaller widths, while the lower semiconductor layers in the remaining semiconductor layers have greater thicknesses and greater widths. In other words, the remaining semiconductor layers have uneven shapes and have a deformation problem. For wider stacked structures, for example, stacked structures with widths of 60 nm or more than 100 nm, the deformation problem caused by the etching process is more serious. For example, since high performance computing (HPC) devices usually require higher currents, a wider stacked structure needs to be formed during the manufacturing process, and therefore the deformation problem of HPC devices is more serious. Since the semiconductor layers will serve as the channel layers, the uneven shapes and deformation of the semiconductor layers may adversely affect the performance of the final semiconductor structure.

In some embodiments, the sacrificial layers 14B shown in FIG. 9A and FIG. 9B include germanium, and the germanium concentrations of the sacrificial layers 14B decrease from bottom to top. For example, the germanium concentrations of the sacrificial layers 14B gradually decrease by a constant amount. For example, the germanium concentration of the lowermost sacrificial layer 14A is 90 at %, and the germanium concentration of the uppermost sacrificial layer 14A is 10 at %. In some embodiments, in any two of the sacrificial layers 14B adjacent to each other in a vertical direction, the germanium concentration of the sacrificial layer below is 5 at % to 15 at % greater than the germanium concentration of the sacrificial layer above. The germanium concentration affects the etching selectivity. In the etching process, the rate of etching the sacrificial layers 14B with higher germanium concentrations is faster. On the contrary, the rate of etching the sacrificial layers 14B with lower germanium concentrations is slower. The present disclosure slows down the etching rate to the upper sacrificial layers 14B and speeds up the etching rate to the lower sacrificial layers 14B by using the structural design in which the germanium concentrations of the sacrificial layers 14B decrease from bottom to top. Therefore, the manufacturing method of the present disclosure can overcome the aforementioned problems of uneven shapes and deformation of the semiconductor layers in the etching process, and make the etching rates to the upper and lower sacrificial layers 14B similar, so that the remaining semiconductor layers 12B (namely the semiconductor layer 12B shown in FIG. 10B) have the same shapes and have similar thicknesses and widths. Therefore, the semiconductor structure made from the semiconductor layers 12B has better performance.

Figure 9D:
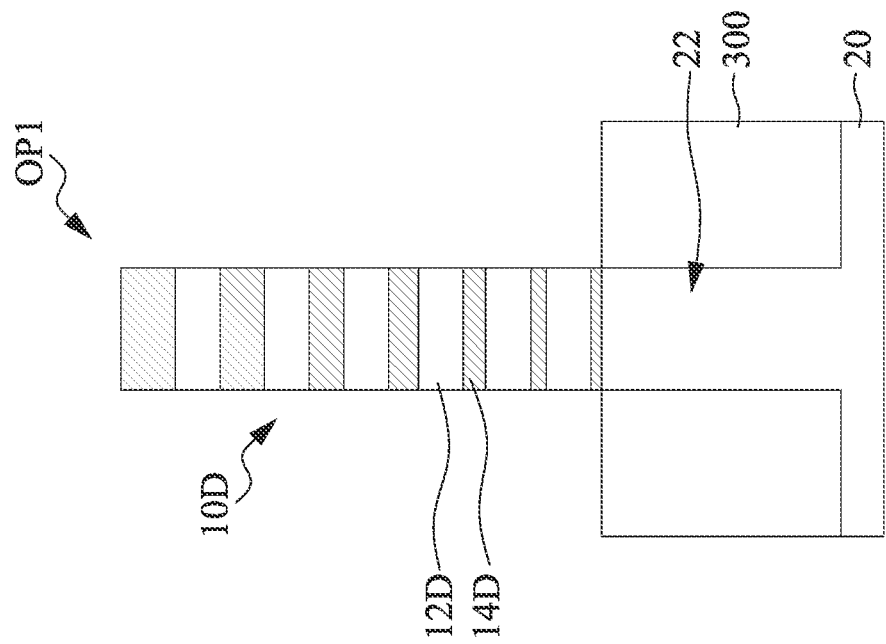
Figure 9C:
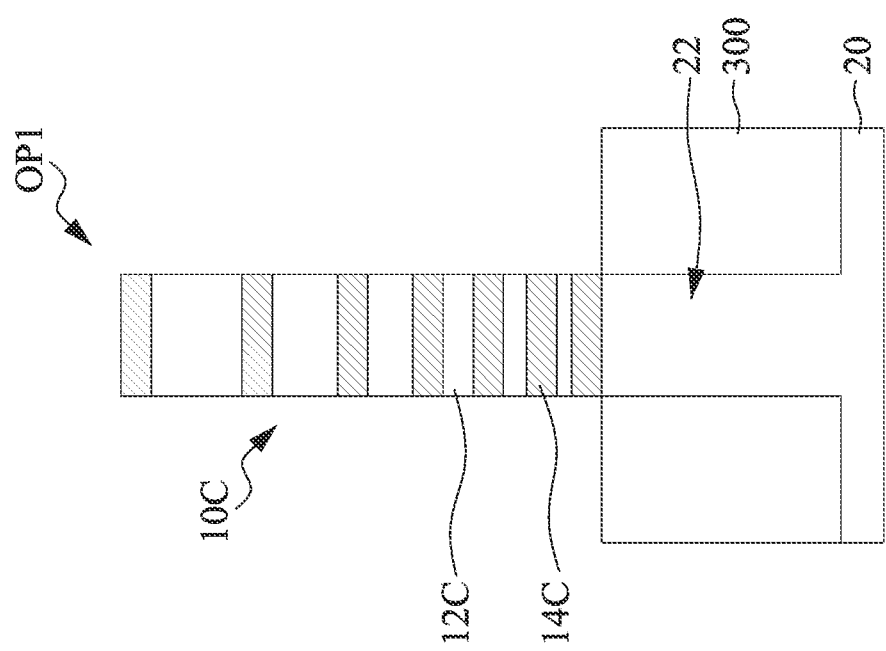

In other embodiments, please refer to FIG. 9C. FIG. 9C is a cross-sectional schematic view of various embodiments in the process of manufacturing the semiconductor structure according to the present disclosure. As shown in FIG. 9C, in a stacked structure 10C, thicknesses of semiconductor layers 12C increase from bottom to top. For example, the thicknesses of the semiconductor layers 12C gradually increase by a constant amount from bottom to top. Next, as shown in FIG. 10A and FIG. 10B, the sacrificial layers 14C are removed from the opening OP1. Please refer to the aforementioned embodiments of removing the sacrificial layers 14B of FIG. 9A and FIG. 9B for the removal embodiment, which will not be repeated here.

As mentioned above, the rate of the etching process for etching the upper part of the stacked structure 10B is faster; the rate of the etching process for etching the lower part of the stacked structure 10B is slower. The present disclosure overcomes the problem of uneven shapes and deformation of the semiconductor layers caused by the etching process by using a structural design that has thicknesses of the semiconductor layers 12C gradually increasing from bottom to top, so that the remaining semiconductor layers (namely the semiconductor layers 12B shown in FIG. 10B) has the same shapes and similar thicknesses and widths. Accordingly, the semiconductor structure manufactured by the semiconductor layers 12C has better performance.

In other embodiments, please refer to FIG. 9D. FIG. 9D is a cross-sectional schematic view of various embodiments in the process of manufacturing the semiconductor structure according to the present disclosure. As shown in FIG. 9D, in a stacked structure 10D, thicknesses of sacrificial layers 14D increase from bottom to top. For example, the thicknesses of the sacrificial layers 14D gradually increase by a constant amount from bottom to top. Next, as shown in FIG. 10A and FIG. 10B, the sacrificial layers 14D are removed from the opening OP1. Please refer to the aforementioned embodiments of removing the sacrificial layers 14B of FIG. 9A and FIG. 9B for the removal embodiments, which will not be repeated here.

As mentioned above, the rate of the etching process for etching the upper part of the stacked structure 10B is faster; the rate of the etching process for etching the lower part of the stacked structure 10B is slower. The present disclosure overcomes the problem of uneven shapes and deformation of the semiconductor layers caused by the etching process by using a structural design that has thicknesses of the sacrificial layers 14D gradually increasing from bottom to top, so that the remaining semiconductor layers (namely the semiconductor layers 12B shown in FIG. 10B) has the same shapes and similar thicknesses and widths. Accordingly, the semiconductor structure manufactured by the semiconductor layers 12D has better performance.

In other embodiments, the embodiments of FIG. 9B and FIG. 9C may be combined. In the stacked structure, the germanium concentrations of the sacrificial layers decrease from bottom to top, and the thicknesses of the semiconductor layers increase from bottom to top. In other embodiments, the embodiments of FIG. 9B and FIG. 9D may be combined. In the stacked structure, the germanium concentrations of the sacrificial layers decrease from bottom to top, and the thicknesses of the sacrificial layers increase from bottom to top. In other embodiments, the embodiments of FIG. 9C and FIG. 9D may be combined. In the stacked structure, the thicknesses of the semiconductor layers and the sacrificial layers increase from bottom to top. In other embodiments, the embodiments of FIG. 9B, FIG. 9C, and FIG. 9D may be combined. In the stacked structure, the germanium concentrations of the sacrificial layers decrease from bottom to top, and the thicknesses of the semiconductor layers and sacrificial layers increase from bottom to top. All the above embodiments can overcome the uneven shapes and deformation of the semiconductor layers caused by the etching process.

Figure 11B:
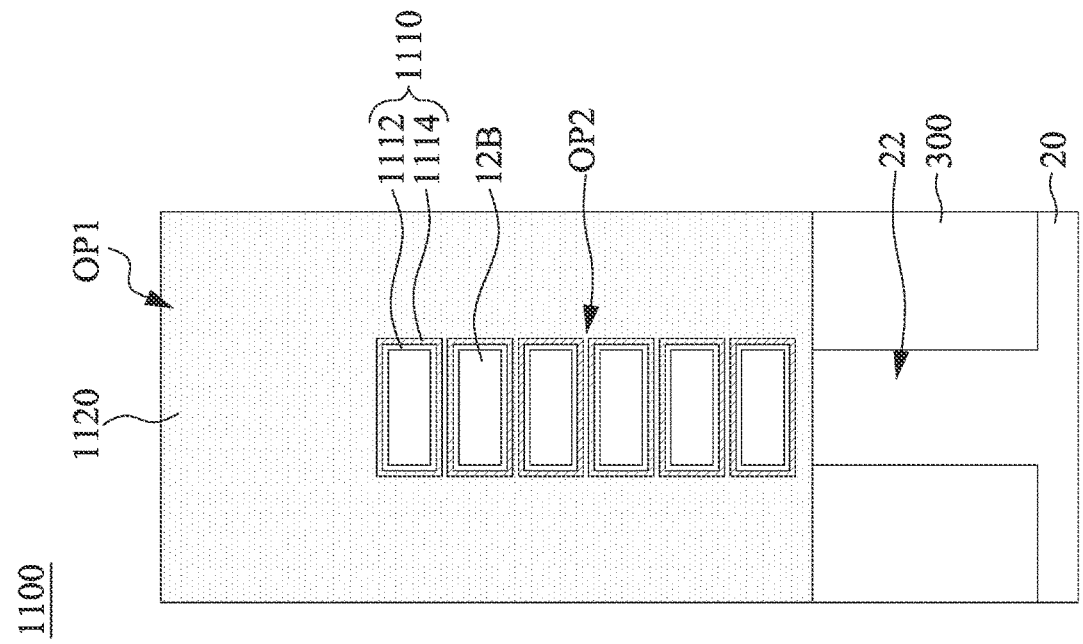
Figure 11A:
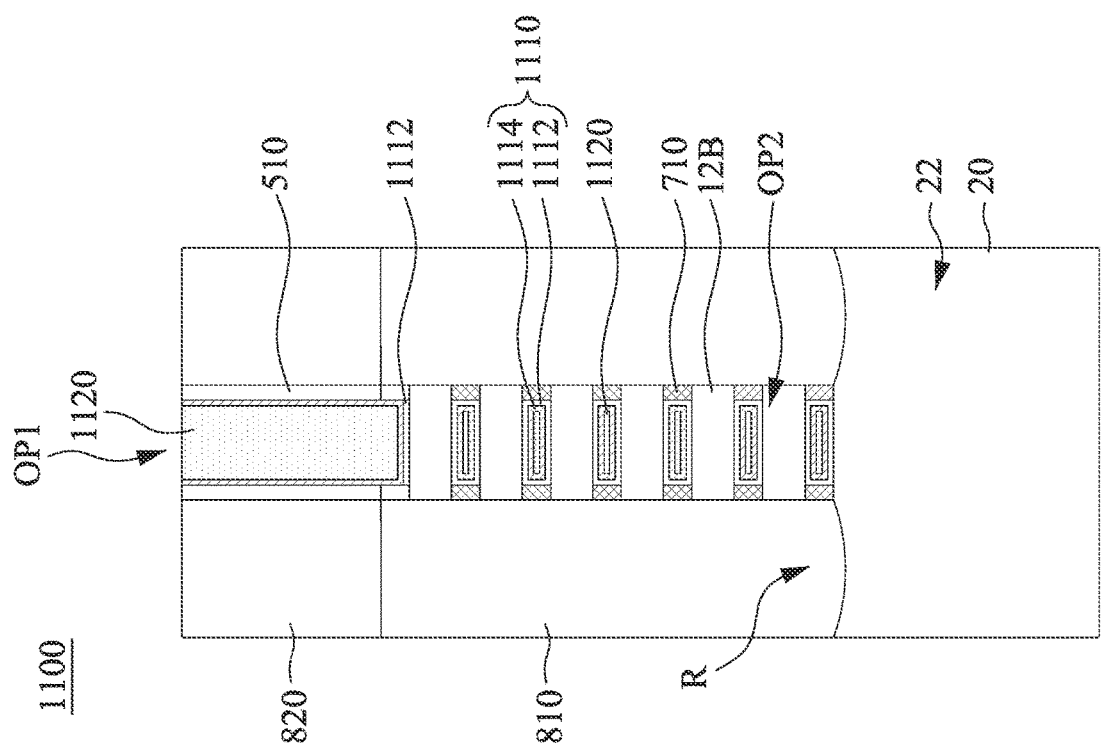

As shown in FIG. 11A and FIG. 11B, a gate dielectric layer 1110 and a gate structure 1120 are formed to cover the semiconductor layers 12B to form a semiconductor structure 1100. The gate dielectric layer 1110 includes a first gate dielectric layer 1112 and a second gate dielectric layer 1114.

The first gate dielectric layer 1112 is, for example, an interface layer, and the second gate dielectric layer 1114 is, for example, a high-k dielectric layer. In some embodiments, the gate structure 1120 includes one or more layers of conductive material, such as a metal layer, a metal nitride layer (e.g., titanium nitride, tantalum nitride, etc.), a metal carbide layer (e.g., titanium carbide), or combinations thereof. By the embodiments of FIG. 9B (the germanium concentrations of the sacrificial layers decrease from bottom to top), FIG. 9C (the thicknesses of the semiconductor layers increase from bottom to top), and FIG. 9D (the thicknesses of the sacrificial layers increase from bottom to top), after removing the sacrificial layers, the remaining semiconductor layers 12B shown in FIG. 11B can have even shapes. Therefore, uniform currents can pass through the semiconductor layers 12B, which serve as the channels of the semiconductor structure 1100, so that the semiconductor structure 1100 has good performance.

In summary, the present disclosure provides a variety of manufacturing methods for the semiconductor structures, which can prevent the semiconductor layers from having a problem of uneven shapes after etching the sacrificial layers by adjusting the germanium concentration distribution of the sacrificial layers, the thickness distribution of the semiconductor layers, and the thickness distribution of the sacrificial layers. Since a wider stacked structure usually has a serious deformation problem after etching, the manufacturing method of the present disclosure can be applied to the wider stacked structure to overcome the deformation problem. In addition, the manufacturing method of the present disclosure has a simple process, and can be easily applied to the current manufacturing process and equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor structure, comprising:
    forming a stacked structure on a substrate, the stacked structure comprising a plurality of semiconductor layers and a plurality of sacrificial layers that are alternately stacked, wherein thicknesses of the semiconductor layers gradually increase by a constant amount from bottom to top, and the forming the stacked structure on the substrate comprises:
        sequentially forming a first sacrificial layer, a first semiconductor layer, a second sacrificial layer, and a second semiconductor layer on the substrate; and
        repeating the sequentially forming the first sacrificial layer, the first semiconductor layer, the second sacrificial layer, and the second semiconductor layer on the substrate;
    forming a dummy gate structure on the stacked structure;
    forming a spacer on both sides of the dummy gate structure;
    removing the dummy gate structure, thereby forming an opening;
    removing the sacrificial layers from the opening; and
    forming a gate structure to cover the semiconductor layers.

2. The manufacturing method of claim 1, wherein the semiconductor layers comprise silicon, silicon carbide, or silicon phosphide, the sacrificial layers comprise silicon-germanium, germanium, or germanium-tin, and germanium concentrations of the sacrificial layers decrease from bottom to top.

3. The manufacturing method of claim 1, wherein thicknesses of the sacrificial layers increase from bottom to top.

4. The manufacturing method of claim 1, wherein in any two of the sacrificial layers adjacent to each other in a vertical direction, germanium concentration of the sacrificial layer below is 5 at % to 15 at % greater than germanium concentration of the sacrificial layer above.

5. The manufacturing method of claim 1, wherein germanium concentrations of the sacrificial layers decrease by a constant amount from bottom to top.

6. The manufacturing method of claim 1, wherein after removing the sacrificial layers from the opening, the semiconductor layers have the same shapes.

7. The manufacturing method of claim 1, wherein the semiconductor layers comprise silicon carbide or silicon phosphide.

8. The manufacturing method of claim 1, wherein the semiconductor layers comprise silicon carbide doped with phosphorus.

9. The manufacturing method of claim 1, wherein the semiconductor layers are doped with a group V element, and the sacrificial layer are doped with a group III element.

10. A manufacturing method of a semiconductor structure, comprising:
    forming a stacked structure on a substrate, the stacked structure comprising a plurality of semiconductor layers and a plurality of sacrificial layers that are alternately stacked, wherein thicknesses of the sacrificial layers gradually increase by a constant amount from bottom to top, and the forming the stacked structure on the substrate comprises:
        sequentially forming a first sacrificial layer, a first semiconductor layer, a second sacrificial layer, and a second semiconductor layer on the substrate; and
        repeating the sequentially forming the first sacrificial layer, the first semiconductor layer, the second sacrificial layer, and the second semiconductor layer on the substrate;
    forming a dummy gate structure on the stacked structure;
    forming a spacer on both sides of the dummy gate structure;
    removing the dummy gate structure, thereby forming an opening;
    removing the sacrificial layers from the opening; and
    forming a gate structure to cover the semiconductor layers.

11. The manufacturing method of claim 10, wherein thicknesses of the semiconductor layers increase from bottom to top.

12. The manufacturing method of claim 10, wherein the semiconductor layers comprise silicon, silicon carbide, or silicon phosphide, and the sacrificial layers comprise silicon-germanium, germanium, or germanium-tin.

13. The manufacturing method of claim 10, wherein the sacrificial layers comprise germanium, and in any two of the sacrificial layers adjacent to each other in a vertical direction, a germanium concentration of the sacrificial layer below is 5 at % to 15 at % greater than a germanium concentration of the sacrificial layer above.

14. The manufacturing method of claim 10, wherein thicknesses of the semiconductor layers gradually increase by a constant amount from bottom to top.

15. The manufacturing method of claim 10, wherein removing the sacrificial layers from the opening is performed by a wet etching.

16. The manufacturing method of claim 10, wherein after removing the sacrificial layers from the opening, the semiconductor layers have the same shapes.

17. The manufacturing method of claim 10, wherein the semiconductor layers comprise silicon carbide or silicon phosphide.

18. The manufacturing method of claim 10, wherein the semiconductor layers comprise silicon carbide doped with phosphorus.

19. The manufacturing method of claim 10, wherein the semiconductor layers are doped with a group V element, and the sacrificial layer are doped with a group III element.

\* \* \* \* \*